(12) United States Patent
Tilton et al.

(10) Patent No.: US 7,301,772 B2
(45) Date of Patent: Nov. 27, 2007

(54) THREE DIMENSIONAL PACKAGING AND COOLING OF MIXED SIGNAL, MIXED POWER DENSITY ELECTRONIC MODULES

(75) Inventors: Donald E. Tilton, Colton, WA (US); Charles L. Tilton, Colton, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

(21) Appl. No.: 11/351,660

(22) Filed: Feb. 9, 2006

(65) Prior Publication Data

US 2006/0126295 A1 Jun. 15, 2006

Related U.S. Application Data

(63) Continuation of application No. 10/769,543, filed on Jan. 30, 2004, now Pat. No. 7,009,842.

(51) Int. Cl.
*H05K 7/20* (2006.01)
(52) U.S. Cl. .................... 361/699; 165/80.4; 174/15.1; 257/714
(58) Field of Classification Search ..................... None
See application file for complete search history.

(56) References Cited

U.S. PATENT DOCUMENTS

| | | |
|---|---|---|
| 3,577,024 A | 5/1971 | Inagaki et al. |
| 3,659,125 A | 4/1972 | Basel |
| 3,733,503 A | 5/1973 | Potter |
| 4,198,191 A | 4/1980 | Pierce |
| 4,329,603 A | 5/1982 | Ballard |
| 4,611,137 A | 9/1986 | Sutrina |
| 4,692,826 A | 9/1987 | Raj et al. |
| 4,912,600 A | 3/1990 | Jaeger et al. |
| 5,220,804 A | 6/1993 | Tilton et al. |
| 5,251,097 A | 10/1993 | Simmons et al. |
| 5,314,529 A | 5/1994 | Tilton et al. |
| 5,675,473 A | 10/1997 | McDunn et al. |
| 5,684,352 A | 11/1997 | Mita et al. |
| 5,713,327 A | 2/1998 | Tilton et al. |
| 5,718,117 A | 2/1998 | McDunn et al. |
| 5,719,444 A | 2/1998 | Tilton et al. |
| 5,731,542 A | 3/1998 | Limper-Brenner et al. |
| 5,831,824 A | 11/1998 | McDunn et al. |
| 5,860,602 A | 1/1999 | Tilton et al. |
| 5,880,931 A | 3/1999 | Tilton et al. |
| 5,933,700 A | 8/1999 | Tilton |
| 5,943,211 A * | 8/1999 | Havey et al. ................ 361/699 |
| 6,016,969 A | 1/2000 | Tilton et al. |
| 6,060,966 A | 5/2000 | Tennant et al. |
| 6,104,610 A | 8/2000 | Tilton et al. |
| 6,108,201 A | 8/2000 | Tilton et al. |

(Continued)

OTHER PUBLICATIONS

Advanced Thermal Management System for General Motors Power Inverter Module.

(Continued)

*Primary Examiner*—Boris Chervinsky
(74) *Attorney, Agent, or Firm*—Wells St. John P.S.

(57) ABSTRACT

An integrated three dimensional packaging and cooling system for cooling an electronic component system with dissimilar power densities and interfering signals.

5 Claims, 4 Drawing Sheets

U.S. PATENT DOCUMENTS

| | | |
|---|---|---|
| 6,313,992 B1 | 11/2001 | Hildebrandt |
| 6,498,725 B2 | 12/2002 | Cole et al. |
| 6,552,901 B2 | 4/2003 | Hildebrandt |
| 6,625,023 B1 | 9/2003 | Morrow et al. |
| 6,710,441 B2 | 3/2004 | Eden et al. |
| 6,737,301 B2 | 5/2004 | Eden et al. |
| 6,817,196 B2* | 11/2004 | Malone et al. ................ 62/171 |
| 6,853,554 B2* | 2/2005 | Bash et al. ................ 361/699 |

OTHER PUBLICATIONS

Ray, W.F., et al., "High Performance Switched Reluctance Brushless DC Drivers", IEEE Transactions On Industry Applications, vol. 1A-22, p. 722, 1986.

Bose, B.K., et al., "Microcomputer Control of Switched Reluctance Motor", IEEE trnasactions On Industry Applications, vol. 1A-22, p. 708, 1986.

Moallem, M., et al., "Effect of Rotor Profiles on the Torque of a Switched Reluctance Motor", IEEE Transactions On Industry, Applications, vol. 28, p. 364, 1992.

Harris, M.R., et al., "Review of the Integral-Horsepower Switched Reluctance Drive", IEEE Transactions On Industry Applications, vol. 1A-22, p. 716, 1986.

Tilton, D.E., Charles, C.L., Pais, M.R., and Morgan, M.J., "High-Flux Spray-Cooling in a Simulated Multichip Module", HTD vol. 206-2, pp. 73-79, ASME National Heat Transfer Conf., Aug. 9-12, San Diego, CA, 1992.

Tilton, D.E., Chow, L.C., and Mahefkey, E.T., "High Power Density Evaporative Cooling", AIAA-87-1536, 22nd AIAA Thermophysics, Conference, Honolulu, Hawaii, Jun. 1987.

Tilton, D.E., Ambrose, J.H., and Chow, L.C., "Closed-System, High-Flux Evaporative Spray Cooling", SAE Paper 892316, Aerotech 89, Anaheim, CA.

Tilton, D.E., Spray Cooling, Ph.D. Dissertation, University of Kentucky, Dept. of Mechanical Engineering, 1989.

Tilton, D.E., Chow, L.C., Mahefkey, E.T., and Switzer, G., "Critical Heat Flux Phenomena in Spray Cooling", AIAA Paper 90-1729, AIAA/ASME 5th Joint Thermophysics and Heat Transfer Conf., Seattle, WA, Jun. 18-20, 1990.

* cited by examiner

THREE DIMENSIONAL PACKAGING AND COOLING OF MIXED SIGNAL, MIXED POWER DENSITY ELECTRONIC MODULES

CROSS REFERENCE TO RELATED APPLICATION

This a continuation of U.S. patent application Ser. No. 10/769,543, filed Jan. 30, 2004; now U.S. Pat. No. 7,009,842 and from which this application claims priority.

TECHNICAL FIELD

This invention relates to a three-dimensional packaging and cooling system for mixed signal and mixed power density electronic modules.

BACKGROUND OF THE INVENTION

Many common electronics applications today utilize mixed signal electronics with Digital, Analog, and Radio Frequency devices and circuits contained on a single functional board or module. Successful operation of such electronics requires that various components be adequately cooled to prevent overheating, and while still providing adequate shielding to prevent Electromagnetic or Radio Frequency Interference (EMI/RFI).

These two requirements post significant challenges when frequencies and power densities of individual components in the module are mixed. In many cases, some devices may preferably operate at frequencies that are orders of magnitude different than others. For example, today's computers are operating at clock speeds at frequencies beyond 1 GHz, while bus speeds and memory speeds are on the order of 100 MHz and local switch mode power converters or regulators operate in the KHz or low MHz range. The power densities of various components can also vary by orders of magnitude, with high power RF amplifiers or advanced microprocessors in the 100 W/cm$^2$ range, while other devices operate on the order of 1 W/cm$^2$.

The traditional method for packaging and cooling such modules is to utilize two-dimensional, planar packaging with forced air convection and conduction cooling methods. Low power density circuits are typically cooled by forced air convection where the thermal path is through the top sides of the component packages. High power devices typically utilize attached heat sinks. In mixed signal applications, different parts of the circuit must be isolated from each other to prevent Electromagnetic or Radio Frequency Interference (EMI/RFI) from adversely influencing the circuit performance. One conventional approach for example for accomplishing this is to segment the circuit card into sections bordered by a ground strip and place a cover containing multiple cavities on top of the board to mate with the ground strips to create a multiple cavity isolated board. This prevents the use of conventional forced air cooling approaches as described above because no air can be circulated through adjacent cavities without violating the effectiveness of the shield. Consequently, most mixed signal modules are cooled by conducting heat from the devices, through the board and into a finned metal heat sink. Higher power devices are typically mounted directly to the heat sink by making a rectangular "hole" through the board.

This traditional method of packaging and cooling is relatively expensive, yields lower reliability, and will be increasingly difficult to effectively utilize in future systems as frequencies and power densities increase. There are three reasons that this approach is expensive. First, the large board sizes utilized to accommodate multiple circuit types/functions on a single card are very complex and more expensive to manufacture. Next, the packaging utilized at the device level to reduce thermal resistance through the card or into the heat sink is expensive because of the requirement to use high conductivity materials with matched coefficients of thermal expansion. Finally, the mechanical parts are complex and require high manufacturing tolerances and complicated assembly. Many of the devices utilized are actually designed to be cooled from the top side, not through the device package and the board. The thermal path through the card has high thermal resistance, consequently yielding high junction temperatures and poor reliability. As these systems move towards the increased use of high performance digital electronics, this method of packaging and cooling will be increasingly difficult to accommodate without further exacerbating the reliability problem because of the trend of increasing power density at the component level.

To alleviate these problems, a new cooling technology which provides the electronics with dielectric fluid has been proposed and described in several patents. The apparatus and method described in U.S. Pat. No. 5,675,473 illustrates the introduction of spray cooling into a traditional multi-cavity, two-dimensional board type of packaging approach described above. While this packaging and cooling approach will indeed provide shielding and improved reliability due to reduced temperature operation as described, this approach will be difficult and costly to implement in practice.

A reason that this method will increase cost is that spray cooling requires the volume flux of spray applied to the electronic components to be matched to the heat flux distribution of the components. Otherwise, cooling performance and device reliability are compromised. Proper cooling is only achieved if a thin liquid film is maintained over the device. If there is too little flow, the liquid layer covering the electronic component will dry out and cause the component to overheat. If the flow to the component is too high, the device will become flooded, and this may reduce the cooling efficiency. Vapor generated at the surface of the component cannot escape effectively and could result in a boiling heat transfer failure mode called burnout.

Even when the volume flux of coolant is properly matched to the heat flux of the device, the excess fluid sprayed within a cavity must be managed, for example, by the method described in U.S. Pat. No. 5,220,804, which prevents or reduces the overflow from adjacent components from interfering and causing flooding type failure conditions.

Thus, the method proposed in U.S. Pat. No. 5,675,473 which describes a single manifold plate that incorporates all of the fluid distribution and return passages and spray hardware would be relatively costly and also exhibit lower than desired yield. Any change to any part of the circuit design will require the use of a new plate assembly to accommodate the required changes to the atomizer array and the fluid return passage designs. Similarly, the failure of any part of the design, on either the card or in the fluid distribution plate requires the entire assembly to be replaced. This type of fluid system would also be very difficult to design for effective operation, due primarily to the need to design a properly balanced two-phase fluid distribution system. With all of the different segments supplied via the same manifold any change in flow rate to a given section alters the pressure drops within the distribution manifold, and consequently may change the discharge pressure in adjacent atomizer groups. This also alters the spray characteristics and flow rates. A worse problem may occur on the fluid return manifold side. A high power density cavity with higher flow rate and high vapor mass fraction will yield a high momentum flow in the exit channel. If this exit channel is in direct communication with a lower power density, lower flow rate cavity, the exit flow from the low power cavity may be impeded, and possibly even backflow, resulting in a flooded operating condition.

The present invention is directed towards one of its objectives namely to provide an improved apparatus and method for 3-dimensional packaging and cooling of mixed signal, mixed power density electronic modules.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Many of the fastening, connection, manufacturing and other means and components utilized in this invention are widely known and used in the field of the invention described, and their exact nature or type is not necessary for an understanding and use of the invention by a person skilled in the art or science; therefore, they will not be discussed in significant detail. Furthermore, the various components shown or described herein for any specific application of this invention can be varied or altered as anticipated by this invention and the practice of a specific application or embodiment of any element may already be widely known or used in the art or by persons skilled in the art or science; therefore, each will not be discussed in significant detail.

The terms "a", "an", and "the" as used in the claims herein are used in conformance with long-standing claim drafting practice and not in a limiting way. Unless specifically set forth herein, the terms "a", "an", and "the" are not limited to one of such elements, but instead mean "at least one".

Figure 1:
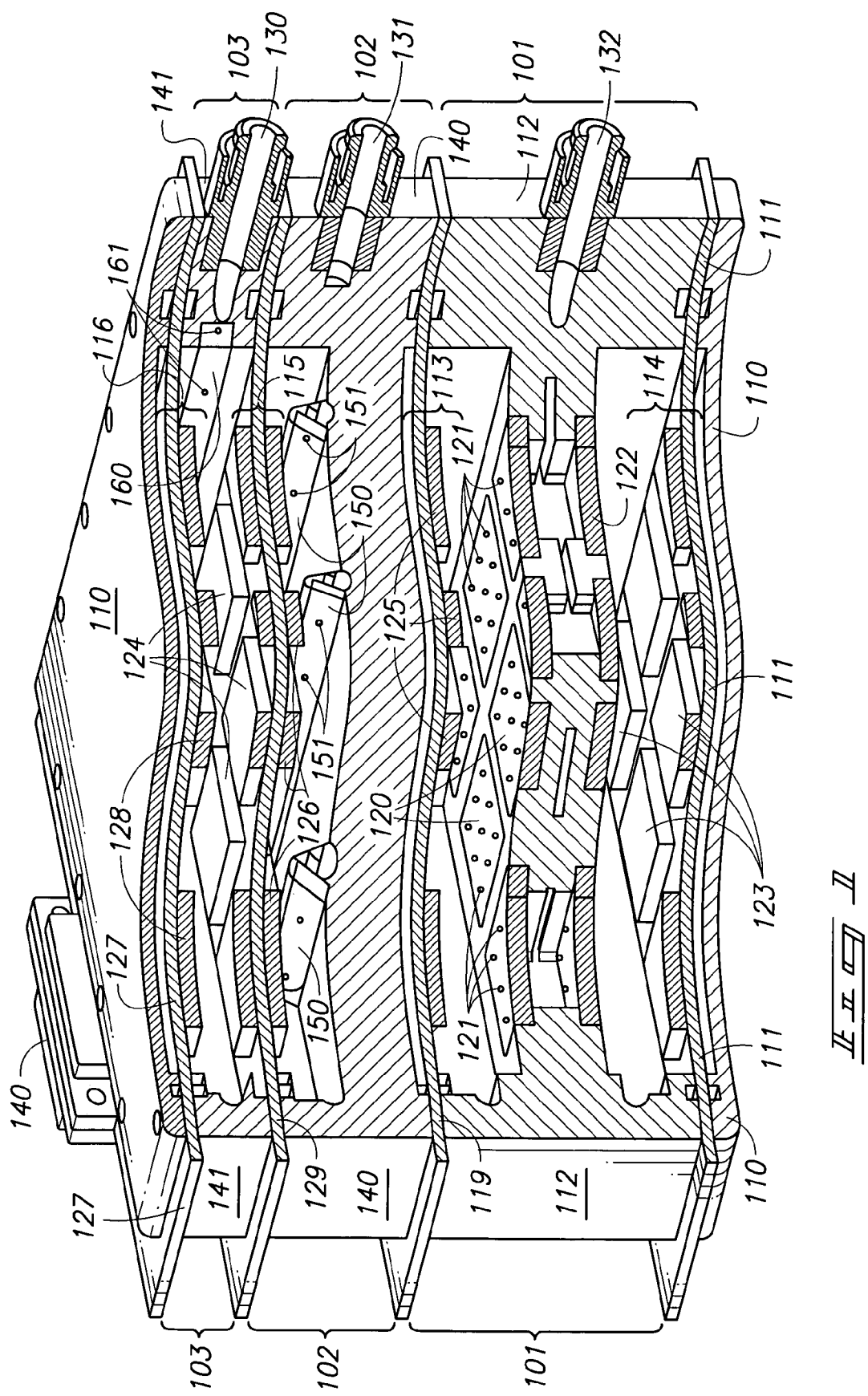
FIG. 1 is a perspective cutaway view of one embodiment of the invention, showing a combination of a transverse spray module, an angled spray module and a direct impingement spray module.

FIG. 1 illustrates a partial cutaway cross section perspective view of an embodiment of this invention wherein there is a transverse narrow gap spray cooling module 103, an angled spray cooling module 102 and a direct impingement spray cooling module 101. The three-dimensional cooling and packaging illustrated in FIG. 1 is one example of a package which is more compact and effective than those in the prior art where all of the electronic componentry on the circuit board was on one circuit card and multiple pockets for sealing are provided. In the embodiment shown, the EMF or other signal shielding to prevent the signal from one electronic component to interfere with the signal from another is provided by the material in the modules, which is typically metallic. Although in many applications the interfering or potentially interfering signal tags are going to be dissimilar, there will be some situations where the first signal type will be the same as the second signal type but still be interfering.

The direct impingement module 101 includes inlet 132, framework 112, first circuit card cavity 114 with first circuit card 111 positioned therein, with electronic modules 123 mounted on first circuit card 111. The second circuit card 119 includes electronic modules 125 mounted thereon and the second circuit card with electronic modules is mounted within second circuit card cavity 113 within direct impingement module 101. Although the direct impingement module 101 is shown with two circuit card cavities, any number of circuit card cavities, one or above, may be utilized as contemplated by this invention.

The direct impingement module 101 includes a plurality of atomizer banks 120 with atomizer nozzles 121 in the second circuit card cavity 113. The atomizer banks 122 in the first circuit card cavity 114 are directed in the opposite direction and would spray on electronic modules 123 mounted on first circuit card 111 within first circuit card cavity 114. This would be referred to as a two-sided or dual-sided direct impingement spray module.

There may be one or more electronic components on first circuit card 111 or second circuit card 119 which are potentially interfering with the electronic components on another circuit card if the electronic components emit an interfering signal type. One of the embodiments of this invention contemplates a first signal type emitted from an electronic component on one circuit board and a second signal type emitted from an electronic component on a second circuit board, wherein the first signal type interferes or potentially interferes with the second signal type.

To give a few examples but not by way of limitation, the first signal type may be a digital signal type and the second an analog signal type, or the first signal type may be analog and the second signal type radio frequency. It will be appreciated and known by those of ordinary skill in the art that any one of a number of different signal types and combinations of signal types may be utilized in embodiments or aspects of this invention.

As stated above, there may also be interference between two like or similar signal types which it may be desirable to prevent. In many cases, the signal types would be attenuated or shielded from one another by the spray modules and atomizers therebetween and additional shielding may not be necessary, depending upon the nature and type of the signal types involved. If additional shielding is required, it may be inserted on the exterior of a module between the dual sides of a two-sided direct impingement module. In many cases, a metal shield will suffice but there may be specialty applications in which metal is not necessary and others types of materials may work more effectively. There is no one particular material or type required to practice this invention.

It will also be appreciated by those of ordinary skill in the art that the shield would not completely cover an area between two circuit cards or electronic components, but in some situations partial shielding may be as effective to prevent interference between the first signal type and a second signal type. It will also be appreciated by those of ordinary skill in the art that the packaging shown in FIG. 1 for example is a fully enclosed closed system in its entirety, although only the cutaway portion is shown.

FIG. 1 also illustrates angled spray module 102, which includes module inlet 131 for receiving cooling fluid, framework 140, plurality of angled spray heads 150 with atomizer nozzles 151 therein. The angled spray heads 150 are positioned relative to electronic components 126 on third circuit card 129. Third circuit card 129 is mounted within third circuit card cavity 115.

FIG. 1 further shows transverse or narrow gap spray module 103, which includes coolant inlet 130, framework 141, spray heads 160, spray nozzles 161 mounted transverse to the electronic modules 124 mounted on the second side of third circuit card 129. Fourth circuit card 127 includes electronic components 128 mounted thereon and which also receive spray cooling from atomizer nozzles 161, transverse spray cooling for thin film evaporative spray cooling of the electronic components 128.

FIG. 1 also shows outer housing 110 mounted to fourth circuit card 127 and electronic connector 140 which is electronically connected and in communication with the circuit cards to provide a mode of electronic input and output of signals thereto and therefrom. It will be appreciated by those of ordinary skill in the art that the particular electronic connector type may be any one of a number of different types, depending on the application, and no one in particular is required to practice this invention. The atomizer nozzles 161 are located within atomizer plate 160; however, it will be appreciated that any one of a number of different types of atomizers may be transversely mounted to accomplish the spray cooling contemplated herein, with no one in particular being required to practice the invention. There may be button-type atomizers, laminated plates or any other.

For purposes of this invention, although only one of the numerous possible embodiments of the housing is shown, it will be appreciated by those of ordinary skill in the art that the invention is not limited to the one embodiment shown. For instance, aspects or embodiments of the system may be in one small part of a larger housing, depending on the application. In further or sub-embodiments of the larger housing, those of ordinary skill in the art would In another aspect, a system may be provided which is configured to receive the electronics to be cooled in an interchangeable fashion such as by edge card connectors, depending on the cooling requirements.

Figure 2:
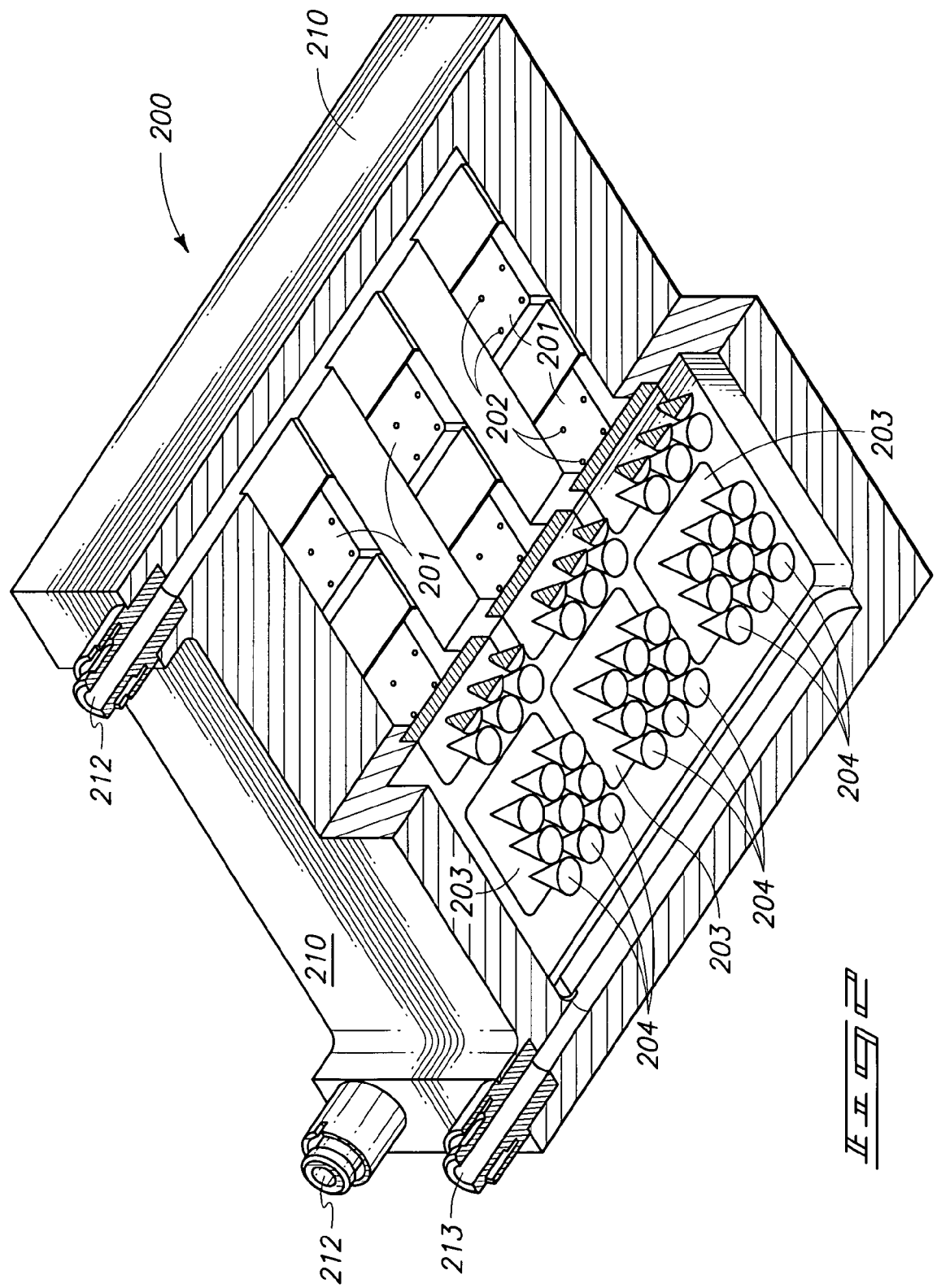
FIG. 2 is a bottom perspective partial cutaway view of one embodiment of a direct impingement spray cooling module which may be utilized as part of this invention.

FIG. 2 is a bottom perspective partial cutaway view of one embodiment of a direct impingement spray module which may be utilized in this invention, in which the atomizers are generally oriented in the same direction as opposed to in opposite directions as shown in the direct impingement spray module 101 shown in FIG. 1. FIG. 2 illustrates a direct impingement spray module 200 with housing 210, coolant inlet 212, bottom coolant outlet 213, and a plurality of atomizer plates 203 on the first level. The atomizer plates 203 (preferably but not necessarily laminated) shown each include nine spray patterns 204 which would be spraying on electronic modules on a circuit card adjacent thereto.

A second set or layer of atomizer plates 201 with atomizer nozzles 202 is also shown in FIG. 2 and would be spray cooling by direct impingement the second circuit card mounted in a cavity adjacent thereto. A direct impingement atomizer nozzle generally sprays at approximately perpendicular from the electronic component, and coolant would generally flow in all directions off the electronic component, as opposed to transverse spray cooling which is generally only in one direction and wherein the atomizer nozzles are mounted generally transverse to the impingement surfaces.

Figure 3:
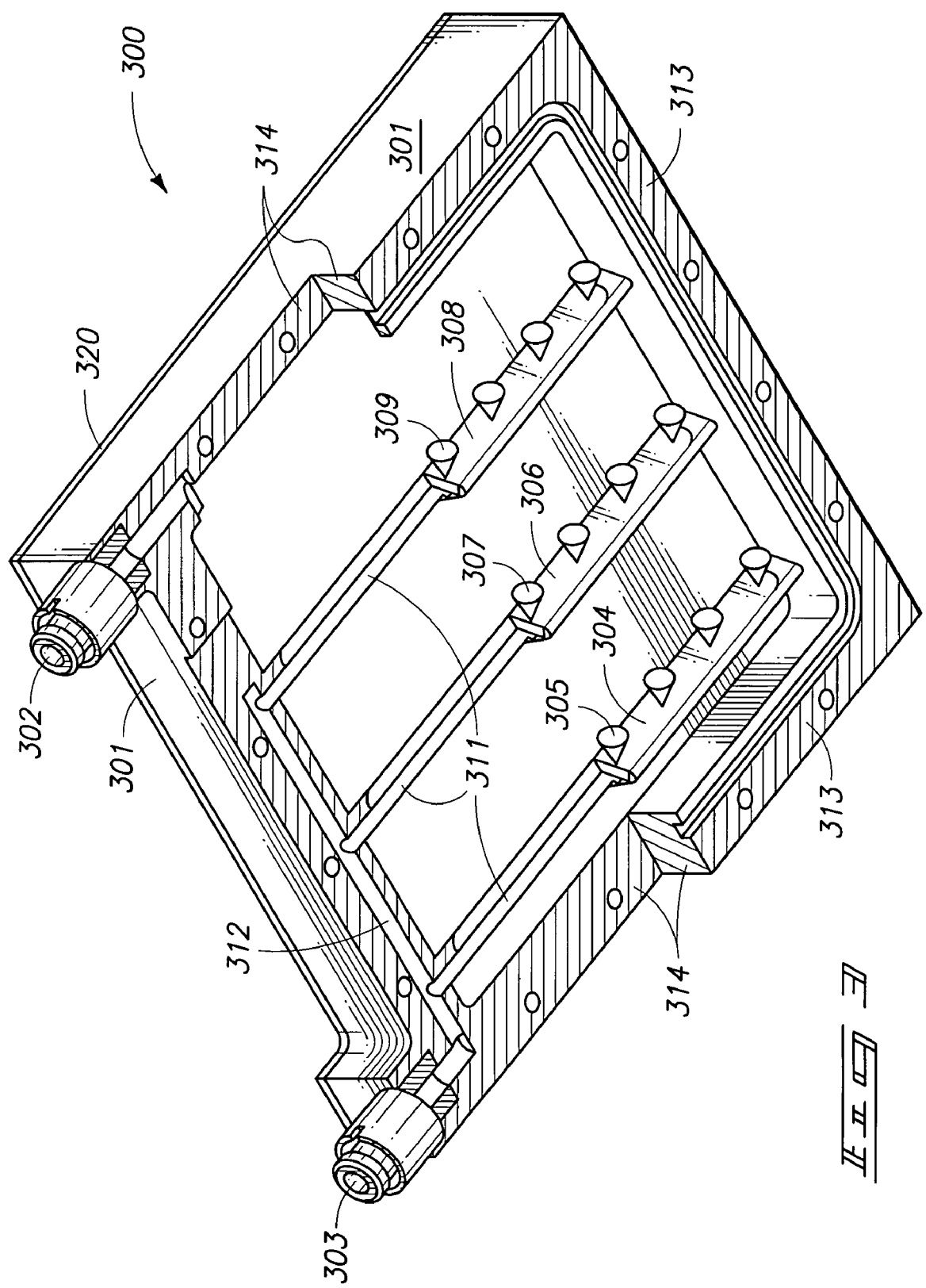
FIG. 3 is a bottom perspective partial cutaway view of one embodiment of an angled spray module which may be utilized in this invention.

FIG. 3 is a bottom perspective view of one embodiment of an angled spray cooling module 300, illustrating coolant inlet 303, coolant outlet 302, framework 301, inlet coolant conduit 312 connecting to atomizer conduits 311 and providing coolant to a first angled atomizer plate 304, second angled atomizer plate 306 and a third angled atomizer plate 308. Spray pattern 305 originates from first angled atomizer plate 304, second spray pattern 307 originates from second angled atomizer plate 306, and third spray pattern 309 originates from third angled atomizer plate 308.

It will be appreciated by those of ordinary skill in the art that the specific spray pattern for each will depend on the circumstances and any one of a number of spray patterns may be utilized to accomplish the results, depending on the circuit card cavity configuration and dimensions and the location and nature of the electronic components on the circuit card to be cooled. Circuit card mounting surface 313 shows a surface which may be utilized to mount to and against the circuit card which includes the electronic components to be cooled, while item 314 shows an area cutaway in cross section within the framework 301, for illustrative purposes.

FIG. 3 further shows a signal shield 320 which may be in plate form mounted on the side of a spray cooling module 300 such as this. The signal shield 320 may be utilized to shield a first signal type emitted from an electronic component on a circuit card within the angled spray module cooling cavity from the second signal type from an electronic component mounted in an adjacent circuit card cavity. As stated above, the material may be metal or any one of a number of different types of materials which are effective or desired for shielding signals. In other embodiments, the spray modules themselves act as the signal shield and a separate layer, shield or plate is unnecessary.

Figure 4:
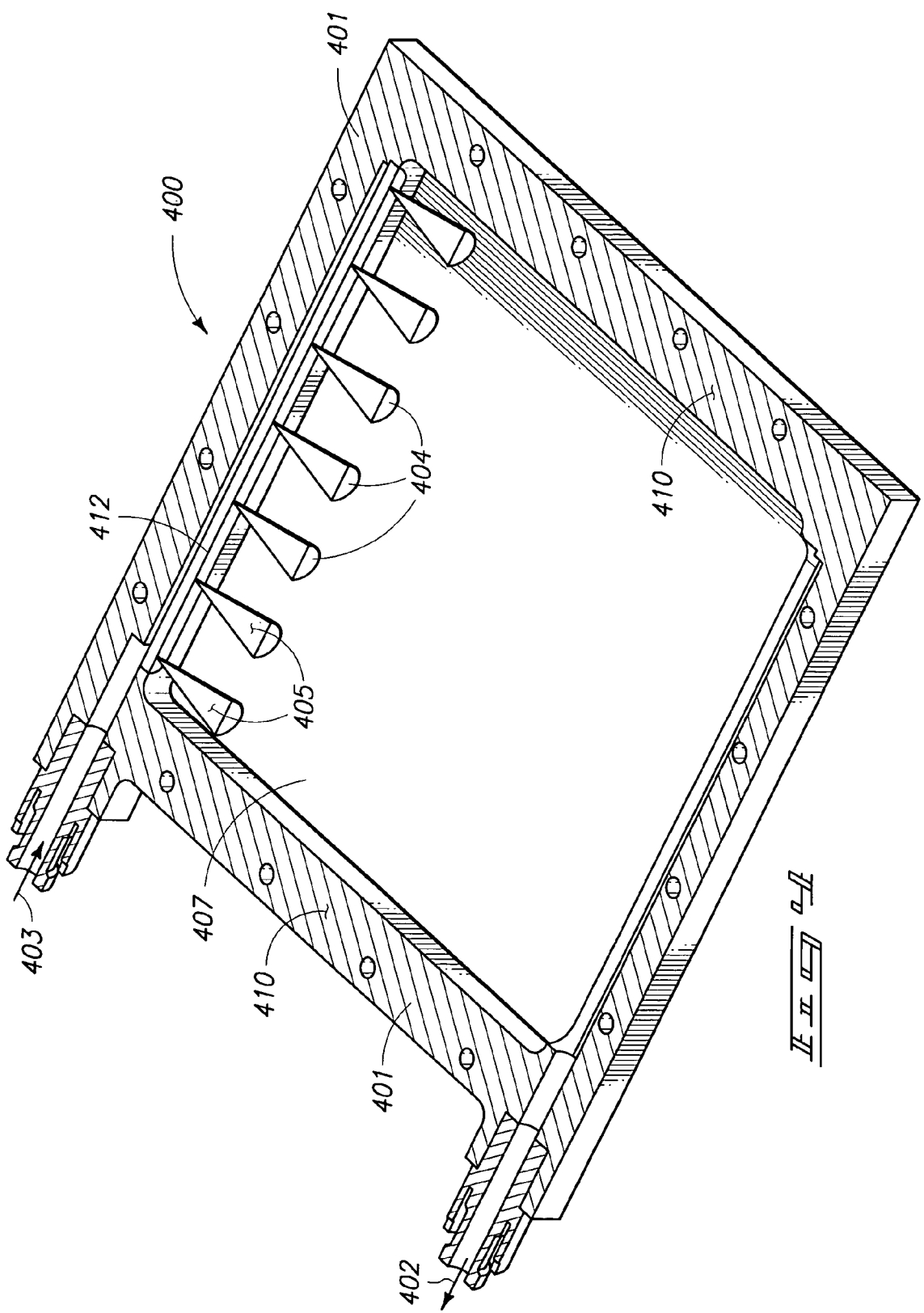
FIG. 4 is a perspective sectional view of an embodiment of a transverse or narrow gap evaporative spray cooling system which may be utilized as part of this invention.

FIG. 4 is an embodiment of a transverse spray module 400 which may be utilized by this invention, illustrating framework 401, circuit card interface surface 410, fluid coolant inlet 403, coolant outlet 402, and spray patterns 404 with a flatter side 405 to improve spray characteristics for the narrow gap 407 cooling cavity.

It is oftentimes desired in embodiments of the invention to obtain a more uniform or as uniform coverage as possible of coolant on the electronic components to be cooled. During the normal course of cooling, without other design features included, all of the vapor that is generated during the cooling process from the evaporation and other factors, and all of the unused liquid, generally must exit the system. In many cases and configurations, the spraying of coolant from the atomizers is an effective vapor pump and creates a low pressure zone in or near the inlet area, as compared to the pressure zone at the outlet area. This may be referred to as an adverse pressure gradient. Since fluid, including vapor, tends to flow from high pressure to low pressure and high pressure tends to develop toward the exit area, the conflict develops and eddies tend to develop in the corners near the inlet or spray atomizers as the vapor tends to move back toward the low pressure area or zones at or near the atomizers or spray coolant inlet, which is the spray side or the entrance side of the circuit card or cavity in which the electronic components are housed or contained. Interfacial drag of vapor and/or liquid and thin liquid creates a drag or pull on the liquid which is on the impingement surface or surface of the electronic components.

When the eddies described above occur and sometimes increase in strength, they have the potential to completely block off or alter the spray pattern originally obtained and desired. This may alter the heat transfer, thin film evaporation and the cooling capacity of the spray cooling system. This results in more spray coolant being provided to the electronic components nearer the spray side and less or inadequate coolant being supplied to the electronic components nearer the exit side, and some may not get any appreciable coolant.

In order to reduce or eliminate this problem, this invention utilizes a technique which may be referred to as "vapor recirculation". There may be any one of a number of embodiments of vapor recirculation which may be utilized by this invention. One way for instance is to provide an opening or openings near the exit side of the circuit card or cooling cavity, the apertures or openings being configured to allow vapor to flow therethrough while impeding the flow of liquid. One way to help keep the liquid out or reduce the liquid which is the eddying in the exit vapor openings is to provide the openings with a large enough cross-sectional area that the entering vapor has a low velocity and does not entrain liquid or draw the liquid into the openings. It is also preferable, although not necessary, that the openings are at least initially near perpendicular or more to the direction of travel of the liquid or even in the opposite direction of the liquid, as liquid does not tend to turn as easily as vapor when flowing. While it would be very difficult to prevent nominal amounts of spray coolant liquid to become entrained, additional precautions may be taken to avoid re-introducing non-atomized liquid.

The vapor may then be routed back toward the spray or inlet side where it is introduced through one or more apertures or openings and provides a vapor velocity to partially or wholly prevent the eddying or backflow effect. If the vapor recirculation conduits are large enough in cross-section, the vapor velocity is reduced and it tends not to draw or entrain as much liquid back toward the inlet area where the vapor is being redirected. In this case no shroud is used to control the fluid but instead the vapor in the system is partially gathered and routed back to or toward the entrance side or the spray side of the cooling cavity or circuit card.

An alternative vapor recirculation system may involve sizing the cooling cavity so wide that the vapor can be recirculated at the far side of such a wider cavity at a low enough velocity within the side channels so that liquid would not be entrained and eddies would not develop. This is not preferable in applications in which size is more important because of obvious size constraints, and further this type of vapor recirculation system may tend to lower heat transfer coefficients. In a narrower channel application of the vapor recirculation system, the higher vapor velocities assist in spreading the cooling liquid or coolant and in thinning or reducing the depth of the liquid film over the electronic components.

It will be appreciated by those of ordinary skill in the art that the specific velocities and thickness of coolant or liquid being evaporated varies from application to application and no one in particular is required to practice this invention.

Another potential vapor recirculation system is to materially increase the amount of coolant that is sprayed and to widen the array of atomizers which provide the atomized coolant to the cooling cavity. This would have the effect of impinging heavily on all of the channel surfaces and, in effect, overpower the vapor trying to backflow or eddy. This embodiment is not preferred in many applications because it requires a substantially higher flow rate of coolant and one atomizer which becomes weak or inoperative will cause a failure of a system because a super low pressure region would then be created where the failure occurred.

The typical and preferred coolant utilized with spray in this invention is fluorinert™, available from 3M. However, this invention is in no way limited to any one particular coolant, as there are many others which may be suitable dielectric coolants, such coolants being known and available in the industry.

Although the invention is certainly not limited to any particular range for cooling, under current practice in cooling, the following method is utilized to design an apparatus according to the present invention. First, the individual circuit cards are analyzed according to the individual device size, power distribution and layout to determine the most desirable spray configuration. Based upon the maximum device heat flux of the individual components, geometry constraints, and the total board power level, and size, the narrow or transverse spray, angled impingement, or normal impingement spray configuration is chosen. The following table serves as a general guideline (not a limitation) for spray cooling with perfluorcarbons.

| Configuration | Max. Device Flux | Avg. Board Flux | z-axis space |
|---|---|---|---|
| Narrow Gap | 20 W/cm$^2$ | 20 W/cm$^2$ | 0.02"–0.25" |
| Angled Impingement | 40 W/cm$^2$ | 30 W/cm$^2$ | 0.25"–0.375" |
| Normal Impingement | 150 W/cm$^2$ | 50 W/cm$^2$ | 0.25"–0.75" |
| Enhanced Surface | 1.5–10.0 × Normal | 1.5–10.0 × Normal | 0.25"–1.0" |

There are other possible embodiments to this invention which may have benefits such as cost reduction, elimination of diamond processing, and improvement of the performance potential, although none of these are required to practice the core invention disclosed herein. Recent cooling studies concerning spray cooling in narrow gaps suggests that a higher performance approach is possible by actually spraying through the computer, rather than relying on costly thick diamond to conduct the heat to the edge. Experiments demonstrate the ability to remove five hundred (500) Watts per board while accommodating the required board pitch.

There are also multiple electromagnetic interference (EMI)-attenuating materials which may be utilized as a signal shield, such as metal and others. These also are known in the art, and the specific composition or nature of the shield may vary greatly with the application and the signal type. For instance, carbon, iron and others may be used as EMI attenuating materials. It will also be appreciated by those of ordinary skill in the art that the shielding may not need to cover 100% of the area between the two electronic components to be shielded, but instead a partial sealing will suffice for the particular application. The systems contemplated by this invention are preferably sealed systems, and numerous methods, materials and other components are known in the industry and will not therefore be discussed in significant detail.

Applicant hereby refers to and incorporates by this reference the following U.S. patents: U.S. Pat. No. 5,675,473 issued Oct. 7, 1997; U.S. Pat. No. 5,220,804 for a high heat flux evaporative spray cooling system; and U.S. Pat. No. 5,860,602 and U.S. Pat. No. 6,016,969, each for a laminated array of pressure swirl atomizers. The laminated array of pressure swirl atomizer patents referred to above may be utilized as one way or mechanism to accomplish the atomizing, even though there are numerous others which are available and now known in the art.

As will be appreciated by those of reasonable skill in the art, there are numerous embodiments to this invention, and variations of elements and components which may be used, all within the scope of this invention.

One embodiment of this invention, for example, is an integrated three dimensional packaging and cooling system for cooling an electronic component system with dissimilar power densities and interfering signals, the electronic component system including a first electronic component with a first signal type and a second electronic component with a second signal type, wherein the first signal type interfere with the second signal type, the system comprising: a system framework with at least one electronic connector mounted thereto, the at least one electronic connector including system input connections and system output connections, the system framework comprising: a system housing; a first circuit card cavity configured to house a first circuit card with the first electronic component mounted thereon; a second circuit card cavity configured to house a second circuit card with the second electronic component mounted thereon; a first signal shield between the first circuit card cavity and the second circuit card cavity, the first signal shield disposed to shield the first electronic component from receiving an interfering second signal type from the second electronic component; a thin-film evaporative spray cooling system comprising: a first spray module configured to provide spray cooling to the first circuit card; a second spray module configured to provide spray cooling to the second circuit card; wherein each of the first spray module and the second spray module comprise a plurality of atomizers in fluid receiving disposition to receive cooling fluid from a system cooling fluid supply, and each of the plurality of atomizers are oriented to spray cooling fluid on the circuit card corresponding to that spray module.

In further possible embodiments of the foregoing as stated in the preceding paragraph, such an integrated system further: wherein the first spray module is integral with the second spray module and further wherein the plurality of atomizers of the first spray module spray cooling fluid in the opposite direction from cooling fluid sprayed by the plurality of atomizers in the second spray module; wherein the integral first spray module and second spray module also comprise the first signal shield; wherein the first spray module is one of: a normal impingement type; an angled impingement type and a transverse spray type; and/or wherein the first spray module is dissimilar to the second spray module. The second spray module may but need not also be one of: a normal impingement type; an angled impingement type and a transverse spray type.

In still other and further embodiments, the above mentioned integrated system (in the second preceding paragraph) may be further provided: wherein the spray module is also the first signal shield; wherein the first signal type is digital and the second signal type is analog; wherein the first signal type is digital and the second signal type is radio frequency; wherein the first signal type is analog and the second signal type is radio frequency; and/or wherein the first signal shield is an electromagnetic-interference attenuating shield.

In another further embodiment, an integrated three dimensional packaging and cooling system may be provided as stated above, and which further comprises: a third circuit card cavity configured to house a third circuit card with a third electronic component mounted thereon, the third circuit card cavity being oriented to house the third circuit card approximately parallel relative to the first circuit card; a second signal shield between the second circuit card cavity and the third circuit card cavity, the second signal shield disposed to shield the second electronic component from receiving an interfering third signal type from the third electronic component; and wherein the thin-film evaporative spray cooling system further comprises a third spray module configured to provide spray cooling to the third circuit card, and further wherein the third spray module comprises a plurality of atomizers in fluid receiving disposition to receive cooling fluid from a system cooling fluid supply, and each atomizer is oriented to spray cooling fluid on the third circuit card.

In further possible embodiments of the embodiment described in the preceding paragraph, such an integrated system further: wherein the second spray module is integral with the first spray module and further wherein the plurality of atomizers of the second spray module spray cooling fluid in the opposite direction from cooling fluid sprayed by the plurality of atomizers in the third spray module; wherein the integral second spray module and third spray module also comprise the second signal shield; wherein the second spray module is one of: a normal impingement type; an angled impingement type and a transverse spray type; and/or wherein the second spray module is dissimilar to the third spray module. The third spray module may but need not also be one of: a normal impingement type; an angled impingement type and a transverse spray type.

In still other and further embodiments to the second preceding paragraph, the above mentioned integrated system may be further provided: wherein the second spray module is also the second signal shield; wherein the second signal type is digital and the third signal type is analog; wherein the second signal type is digital and the third signal type is radio frequency; wherein the second signal type is analog and the third signal type is radio frequency; and/or wherein the second signal shield is an electromagnetic-interference attenuating shield.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proer scope of the appended claims appropriately interpreted in accordance with the doctrine of equivalents.

We claim:

1. An integrated three dimensional packaging and cooling system for cooling an electronic component system comprising:
   a system framework with at least one electronic connector mounted thereto, the at least one electronic connector including system input connections and system output connections, the system framework comprising:
      a system housing;
      a first circuit card cavity configured to house a first circuit card with the first electronic component mounted thereon;
      a second circuit card cavity configured to house a second circuit card with the second electronic component mounted thereon;
   a first signal shield between the first circuit card cavity and the second circuit card cavity, the first signal shield disposed to shield the first electronic component from receiving an interfering second signal type from the second electronic component; and
   a thin-film evaporative spray cooling system comprising:
      a first spray module configured to provide evaporative spray cooling to the first circuit card;
      a second spray module configured to provide evaporative spray cooling to the second circuit card;
      wherein each of the first spray module and the second spray module comprise a plurality of atomizers in fluid receiving disposition to receive cooling fluid from a system cooling fluid supply, and each of the plurality of atomizers are oriented to spray cooling fluid on the circuit card corresponding to that spray module.

2. An integrated three dimensional packaging and cooling system as recited in claim 1, and further comprising:
a third circuit card cavity configured to house a third circuit card with a third electronic component mounted thereon, the third circuit card cavity being oriented to house the third circuit card approximately parallel relative to the first circuit card;
a second signal shield between the second circuit card cavity and the third circuit card cavity, the second signal shield disposed to shield the second electronic component from receiving an interfering third signal type from the third electronic component; and
wherein the thin-film evaporative spray cooling system further comprises a third spray module configured to provide spray cooling to the third circuit card, and further wherein the third spray module comprises a plurality of atomizers in fluid receiving disposition to receive cooling fluid from a system cooling fluid supply, and each atomizer is oriented to spray cooling fluid on the third circuit card.

3. An integrated three dimensional packaging and cooling system as recited in claim 1, and further wherein the first spray module and the second spray module each include a coolant inlet in fluid receiving disposition to receive cooling fluid from a system cooling fluid supply, and each of the plurality of atomizers are oriented to spray cooling fluid on the circuit card corresponding to that spray module.

4. An integrated three dimensional packaging and cooling system as recited in claim 1, and further wherein the first spray module and the second spray module each include a coolant outlet in fluid receiving disposition to receive cooling fluid from within the first spray module and the second spray module respectively, and to deliver the cooling fluid outside of the spray module.

5. An integrated three dimensional packaging and cooling system as recited in claim 3, and further wherein the first spray module and the second spray module each include a coolant outlet in fluid receiving disposition to receive cooling fluid from within the first spray module and the second spray module respectively, and to deliver the cooling fluid outside of the spray module.

* * * * *